United States Patent
Cheng et al.

(10) Patent No.: US 9,315,378 B2
(45) Date of Patent: Apr. 19, 2016

(54) METHODS FOR PACKAGING A MICROELECTROMECHANICAL SYSTEM (MEMS) WAFER AND APPLICATION-SPECIFIC INTEGRATED CIRCUIT (ASIC) DIES USING WIRE BONDING

(71) Applicant: Taiwan Semiconductor Manufacturing Co., Ltd., Hsin-Chu (TW)

(72) Inventors: Chun-Wen Cheng, Zhubei (TW); Hung-Chia Tsai, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/457,168

(22) Filed: Aug. 12, 2014

(65) Prior Publication Data

US 2016/0046484 A1    Feb. 18, 2016

(51) Int. Cl.
*H01L 29/84*    (2006.01)
*B81B 7/00*    (2006.01)
*B81C 1/00*    (2006.01)

(52) U.S. Cl.
CPC .............. *B81B 7/008* (2013.01); *B81C 1/0023* (2013.01); *B81B 7/0006* (2013.01); *B81B 7/0074* (2013.01)

(58) Field of Classification Search
CPC .... B81B 7/008; B81B 7/0006; B81B 7/0074; B81C 1/0023

USPC ......................................................... 257/415
See application file for complete search history.

(56) References Cited

U.S. PATENT DOCUMENTS

| | | | | |
|---|---|---|---|---|
| 7,642,611 B2* | 1/2010 | Tsuji | ..................... | B81B 7/0048 257/414 |
| 8,525,324 B2* | 9/2013 | Chang | ................... | B81C 1/0023 257/704 |
| 8,847,375 B2* | 9/2014 | Shah | ....................... | B81C 1/003 257/686 |
| 9,096,421 B2* | 8/2015 | Ziglioli | ................ | B81C 1/0023 |
| 2007/0090536 A1* | 4/2007 | Sakai | ................... | B81C 1/0023 257/778 |

* cited by examiner

*Primary Examiner* — Luan C Thai
(74) *Attorney, Agent, or Firm* — Eschweiler & Associates, LLC

(57) ABSTRACT

A method for packaging a microelectromechanical system (MEMS) device with an integrated circuit die using wire bonds is provided. According to the method, a MEMS substrate having a MEMS device is provided. A cap substrate is secured to a top surface of the MEMS substrate. The cap substrate includes a recess corresponding to the MEMS device in a bottom surface of the cap substrate. An integrated circuit die is secured to a top surface of the cap substrate over the recess. A conductive stud or external wire bond electrically coupled with the integrated circuit die and extending vertically up is formed. A housing covering the MEMS substrate, the cap substrate, and the integrated circuit die, and with a top surface approximately coplanar with a top surface of the conductive stud or external wire bond, is formed. The structure resulting from application of the method is also provided.

20 Claims, 16 Drawing Sheets

METHODS FOR PACKAGING A MICROELECTROMECHANICAL SYSTEM (MEMS) WAFER AND APPLICATION-SPECIFIC INTEGRATED CIRCUIT (ASIC) DIES USING WIRE BONDING

BACKGROUND

Microelectromechanical system (MEMS) devices, such as accelerometers, pressure sensors, and gyroscopes, have found widespread use in many modern day electronic devices. For example, MEMS accelerometers are commonly found in automobiles (e.g., in airbag deployment systems), tablet computers, or in smart phones. For many applications, MEMS devices are electrically connected to application-specific integrated circuits (ASICs) to form complete MEMS systems. Commonly, the connections are formed by wire bonding, but other approaches are also possible.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
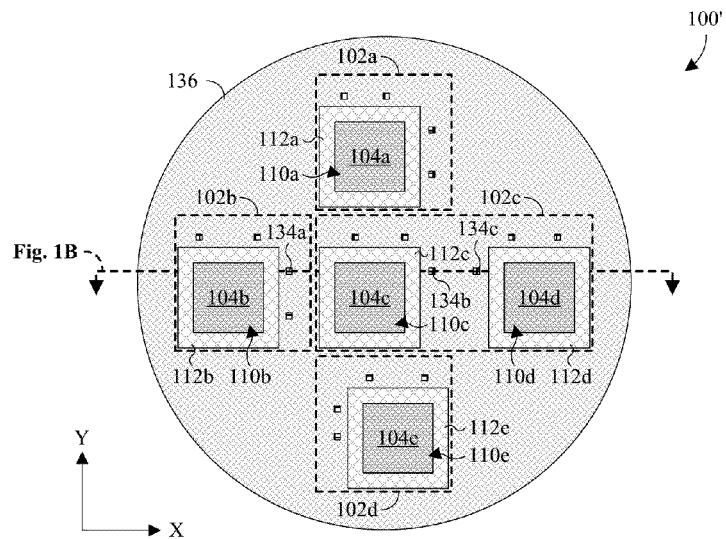
FIG. 1A illustrates a top view of some embodiments of a structure having a plurality of microelectromechanical system (MEMS) packages, the structure including a MEMS wafer, a cap wafer, application-specific integrated circuits (ASIC) dies, wire bonds, and conductive studs collectively defining the MEMS packages.
Figure 1B:
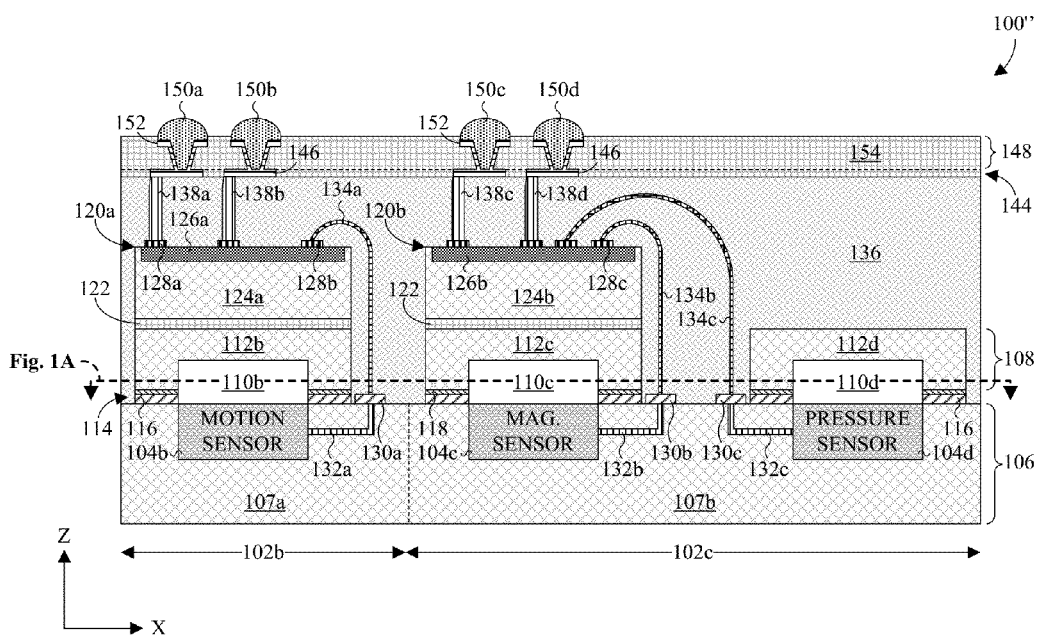
FIG. 1B illustrates a cross-sectional view of some embodiments of the structure of FIG. 1A.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To an increasing extent, modern day electronic devices are incorporating microelectromechanical system (MEMS) devices, such as accelerometers or gyroscopes, for numerous applications. For many applications, the MEMS devices are electrically connected to, and packaged with, application-specific integrated circuits (ASICs) that serve as interfaces between the MEMS devices and the electronic devices. The bulk manufacture of MEMS devices and ASICs has been one of the key enabling technologies for the increasing use of MEMS devices within electronic devices.

During the bulk manufacture of MEMS devices, a plurality of MEMS devices is formed over and/or within a MEMS wafer, typically 8 inches in diameter. Thereafter, a cap wafer having the same or a similar diameter as the MEMS wafer is arranged over and secured to the MEMS wafer. The bottom surface of the cap wafer includes recesses corresponding to the MEMS devices. When the cap wafer is arranged over and secured to the MEMS wafer, chambers including the recesses are formed over and abutting corresponding MEMS devices between the MEMS and cap wafers. The combined MEMS and cap wafers are then singulated or diced to form individual MEMS dies, each including at least one MEMS device.

Similar to MEMS devices, during the bulk manufacture of ASIC devices, a plurality of ASICs is formed over and/or within an ASIC wafer, typically 12 inches in diameter. Further, the plurality of ASICS is typically formed using complementary metal-oxide-semiconductor (CMOS) technology. The ASIC wafer is then singulated or diced to form individual ASIC dies, each including at least one ASIC.

To package a bulk manufactured ASIC and a bulk manufactured MEMS device together for use within an electronic device, according to some methods, an ASIC die corresponding to the ASIC is arranged over a substrate. Further, an MEMS die corresponding to the MEMS device is arranged over the ASIC. With the MEMS die arranged atop the ASIC die, the ASIC die and the MEMS die are connected to each other and/or the substrate by, for example, wire bonding. A housing is then molded over and around the ASIC die and the MEMS die.

A challenge with packaging the ASIC and the MEMS device according to the foregoing methods is that the package has a big footprint. It takes a lot of area when incorporated into an electronic device. Another challenge with packaging the ASIC and the MEMS device according to the foregoing methods is that it's difficult to reduce the height of the package. In view of the foregoing, the present disclosure is directed to an improved method for packaging bulk manufactured ASICs and a bulk manufacture MEMS devices together, as well as the resulting package structure.

According to the improved method, a cap wafer is arranged over and secured to a MEMS wafer including a plurality of MEMS devices. The cap wafer includes caps corresponding to the MEMS devices and typically spaced in at least one dimension. Each cap is associated with a recess in a bottom surface of the cap wafer and corresponds to those regions of the cap wafer surrounding the recess. ASIC dies are then respectively arranged over and secured to top surfaces of the caps, and internal wire bonds (providing connections internal to the packages) are formed between the MEMS wafer and the ASIC dies. Further, conductive studs or external wire bonds (providing connections external to the packages) are formed extending vertically up from the ASIC dies and/or the MEMS wafer. Thereafter, a housing is formed over and around the MEMS and cap wafers, and the ASIC dies, with a top surface coplanar with top surfaces of the conductive studs or the external wire bonds. With the housing formed, a redistribution layer (RDL) is formed over the housing in electrical communication with the ASIC dies and/or the MEMS wafer by way of the conductive studs or the external wire bonds. Further, a ball grid array (BGA) is formed over the RDL and in electrical communication with the RDL, thereby resulting in a plurality of MEMS packages integrated into a common structure. The common structure is diced or singulated to separate the packages.

The improved method describes an approach to packaging bulk manufactured ASICs and bulk manufacture MEMS devices by connecting ASIC dies to a MEMS wafer. No method for packaging bulk manufactured ASICs with bulk manufactured MEMS devices is known to perform such packaging between MEMS devices at the wafer level and ASICs at the die level. Advantageously, because MEMS dies and ASIC dies are not stacked over a substrate for packaging, the form factor of individual packages is improved. Both the foot print and the height of the individual packages is reduced. Further, the improved method advantageously extends the performance of MEMS devices with ASICs.

With reference to FIGS. 1A & B, top and cross-sectional views 100', 100" are respectively illustrated for some embodiments of a plurality of MEMS packages 102a-d. The MEMS packages 102 are shown as being integrated together into a common structure, described in detail hereafter. However, in practice, the common structure is diced to separate the MEMS packages 102 for individual use. Further, although the common structure is illustrated with 4 MEMS packages 102, more or less packages are amenable.

The MEMS packages 102 include corresponding MEMS devices 104a-e arranged over and/or within a top surface of a MEMS wafer 106 acting as a substrate for the MEMS devices 104. Each MEMS package 102 includes at least one MEMS device 104 and, in some embodiments, more than one MEMS device 104. Further, each MEMS package 102 includes a portion (or region) 107a, 107b of the MEMS wafer 106 (acting as a substrate) within or over which the corresponding MEMS devices 104 are arranged. The MEMS devices 104 include, for example, one or more of gyroscopes, accelerometers, microphones, pressure sensors, motion sensors, and magnetic sensors. The MEMS wafer 106 is, for example, a bulk silicon wafer and/or is, for example, an 8 inch wafer.

A cap wafer 108 is arranged over and bonded to the MEMS wafer 106 to define chambers 110a-e over and abutting corresponding MEMS devices 104. The cap wafer 108 includes caps 112a-e corresponding to the MEMS devices 104 and recesses in the bottom surface of the cap wafer 108 corresponding to the MEMS devices 104. Each cap 112 is associated with one or more of these recesses and corresponds to those regions of the cap wafer 108 surrounding the one or more of these recesses. In some embodiments, the caps 112 are individual to the recesses and/or the MEMS devices 104.

Further, in some embodiments, the caps 112 are laterally spaced in at least one dimension. For example, the cap wafer 108 can be partially or fully singulated or diced to space the caps 112. Each of the chambers 110 is defined between a corresponding cap 112 and the MEMS wafer 106. In some embodiments, the chambers 110 include a chamber 110 for each MEMS device 104. Further, in some embodiments, the chambers 110 wholly or substantially cover the MEMS devices 104. The cap wafer 108 is, for example, a bulk silicon wafer and/or is, for example, an 8 inch wafer.

The cap wafer 108 is bonded to the MEMS wafer 106 by way of a cap bonding structure 114 arranged outside of the chambers 110 between the MEMS and cap wafers 106, 108. In some embodiments, the cap bonding structure 114 includes a first cap bonding substructure 116 and a second cap bonding substructure 118 abutting the first cap bonding substructure 116. The first cap bonding substructure 116 is arranged over the top surface of the MEMS wafer 106, and the second cap bonding substructure 118 is arranged over the bottom surface of the cap wafer 108. The first cap bonding substructure 116 is, for example, comprised of aluminum copper (AlCu), and the second cap bonding substructure 118 is, for example, comprised of germanium (Ge).

The MEMS packages 102 further include corresponding ASIC dies 120a, 120b arranged over and bonded to top surfaces of corresponding caps 112 of the cap wafer 108. Each MEMS package 102 includes at least one ASIC die 120 and, in some embodiments, more than one ASIC die 120. The ASIC dies 120 are bonded to the top surfaces of the corresponding caps 112 by an ASIC bonding structure 122 comprising, for example, an epoxy. Further, the ASIC dies 120 each include a substrate 124a, 124b, such as silicon substrate, and one or more ASICs 126a, 126b over and/or within a top surface of the substrate 124.

The ASICs 126 of the ASIC dies 120 include logic devices (e.g., CMOS transistors) to operate the MEMS devices 104 and provide an interface between the MEMS devices 104 and external electronic devices. Typically, there is a one-to-one coupling between the ASICs 126 and the MEMS devices 104, but a one-to-many coupling is also contemplated. Further, the ASICs 126 are associated with ASIC bond pads 128a-c arranged over the ASICs 126 to facilitate an electrical connection with the ASICs 126. For readability, only some of the ASIC bond pads 128 are specifically labeled. The ASIC bond pads 128 are, for example, metal.

In some embodiments, MEMS bond pads 130a-c are arranged over the top surface of the MEMS wafer 106 between the caps 112 of the cap wafer 108 and between the cap bonding structure 114. Further, MEMS interconnects 132a-c are arranged within the MEMS wafer 106 to electrically couple the MEMS bond pads 130 to the MEMS devices 104, and internal wire bonds 134a-c are arranged between the MEMS bond pads 130 and the ASIC bond pads 128 to electrically couple the ASICs 126 to the MEMS devices 104. The internal wire bonds 134 are internal in that the internal wire bonds 134 provide connections between structures internal to the MEMS packages 102. Further, in some embodiments, the internal wire bonds 134 have a diameter of about 25-70 micrometers and/or are, for example, comprised of copper. For readability, only some of the internal wire bonds 134 are specifically labeled. The MEMS interconnects 132 are, for example, comprised of polysilicon, and the MEMS bond pads 130 are, for example, comprised of AlCu.

A housing 136, typically a molded housing, is arranged over and around the ASIC dies 120, the cap wafers 108, and the MEMS wafer 106. In some embodiments, the housing 136 includes a planar top surface. Conductive studs 138a-d extend from the top surface of the housing 136 into the housing 136 to corresponding ASICs 126 or corresponding ASIC bond pads 128. The conductive studs 138 typically have a generally rectangular profile that, in some embodiments, narrows towards the top surface of the housing 136. The conductive studs 138 are, for example, comprised of copper and/or are, for example, about 25-70 micrometers in diameter.

A redistribution layer (RDL) 144 is arranged over the top surface of the housing 136 and includes an RDL conductive structure 146 to electrically connect the ASICs 126, by way of the conductive studs 138, to a ball grid array (BGA) 148. The BGA 148 is arranged over the RDL 144 and includes a plurality of solder balls 150a-d electrically connected to the RDL 144 by way of a BGA conductive structure 152. A RDL/BGA bonding structure 154 is arranged over the RDL 144 and around the BGA 148 to bond the RDL 144 and the BGA 148 to the housing 136 and/or otherwise protect the RDL 144 and the BGA 148. The RDL/BGA bonding structure 154 is, for example, an epoxy.

Figure 2A:
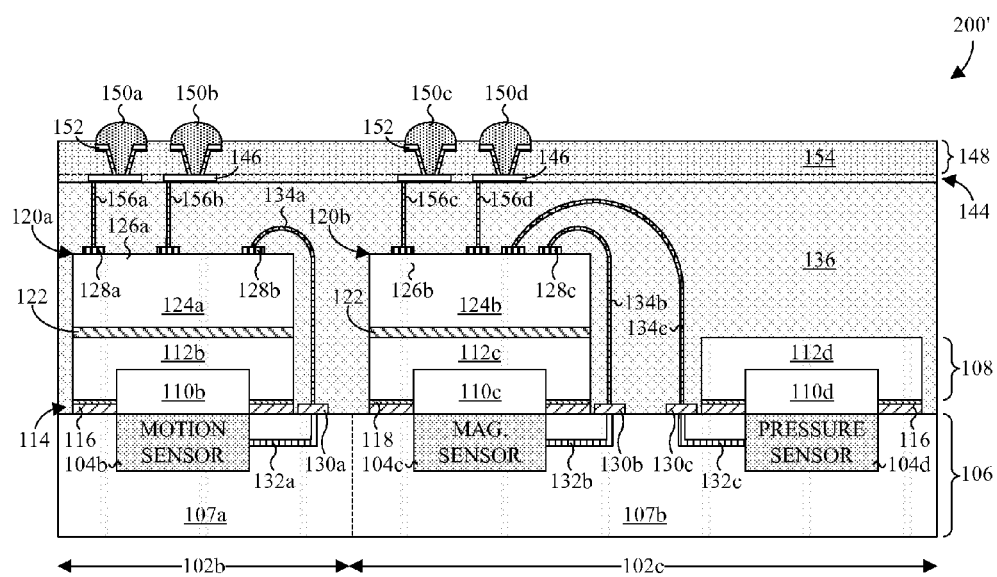
FIGS. 2A and 2B illustrate cross-sectional views of various embodiments of a structure having a plurality of MEMS packages, the structure including a MEMS wafer, a cap wafer, ASIC dies, and wire bonds collectively defining the MEMS packages.

With reference to FIG. 2A, a cross-sectional view 200' is illustrated for alternative embodiments of the plurality of MEMS packages 102. In contrast with the embodiments of FIGS. 1A & B, the present embodiments do not employ conductive studs 138. Rather, the present embodiments employ external wire bonds 156a-d extending from the top surface of the housing 136 into the housing 136 to corresponding ASICs 126 or corresponding ASIC bond pads 128. The external wire bonds 156 are external in that the external wire bonds 156 provide connections between structures external to the MEMS packages 102 and structures internal to the MEMS packages 102. Further, in some embodiments, the external wire bonds 156 have a diameter of about 25-70 micrometers and/or are, for example, comprised of copper.

Figure 2B:
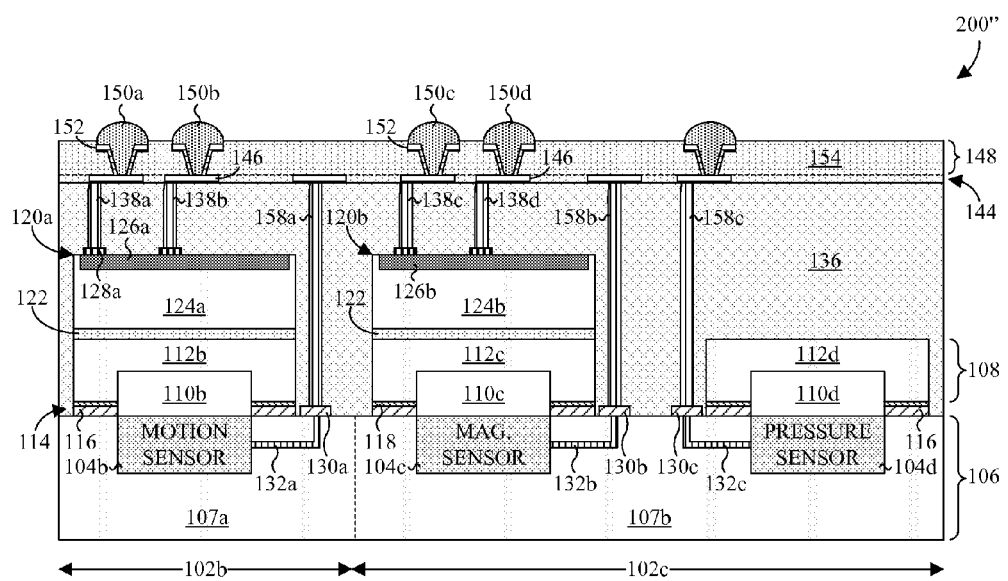

With reference to FIG. 2B, a cross-sectional view 200" is illustrated for other alternative embodiments of the plurality of MEMS packages 102. In contrast with the embodiments of FIGS. 1A & B, the present embodiments employ additional conductive studs 158a-c in place of the internal wire bonds 134. In that regard, the additional conductive studs 158a-c electrically connect the MEMS bond pads 130 to the RDL 144 and, in some embodiments, the BGA 148. The ASICs 126 can then be connected to the MEMS devices 104 by the RDL 144 or externally by way of the BGA 148.

Advantageously, by packaging MEMS devices at the wafer level, as opposed to the die level, the form factors of resulting MEMS packages are improved. Namely, because the MEMS dies and the ASIC dies are not arranged over additional substrates for packaging, the footprints of the MEMS packages are reduced. Similarly, the heights of the MEMS packages are reduced. Whereas the heights of known MEMS packages were defined partially by the heights of the additional substrates over which the ASIC and MEMS dies were arranged, the MEMS packages described herein do not have such additional substrates and thus have reduced heights compared to known packages.

As described above, in some embodiments, the common structure illustrated in FIGS. 1A & B, as well as FIGS. 2A and 2B, is singulated. In such embodiments, the MEMS substrate 106 and the cap wafer 108 are separated into discreet, independent regions corresponding to the MEMS packages 102. Each MEMS package 102 includes the corresponding region of the MEMS substrate 106 and the corresponding region of the cap wafer 108. The corresponding regions of the MEMS and cap wafers 106, 108 of MEMS package 102 are respectively MEMS and cap substrates for the MEMS package 102.

Figure 3:
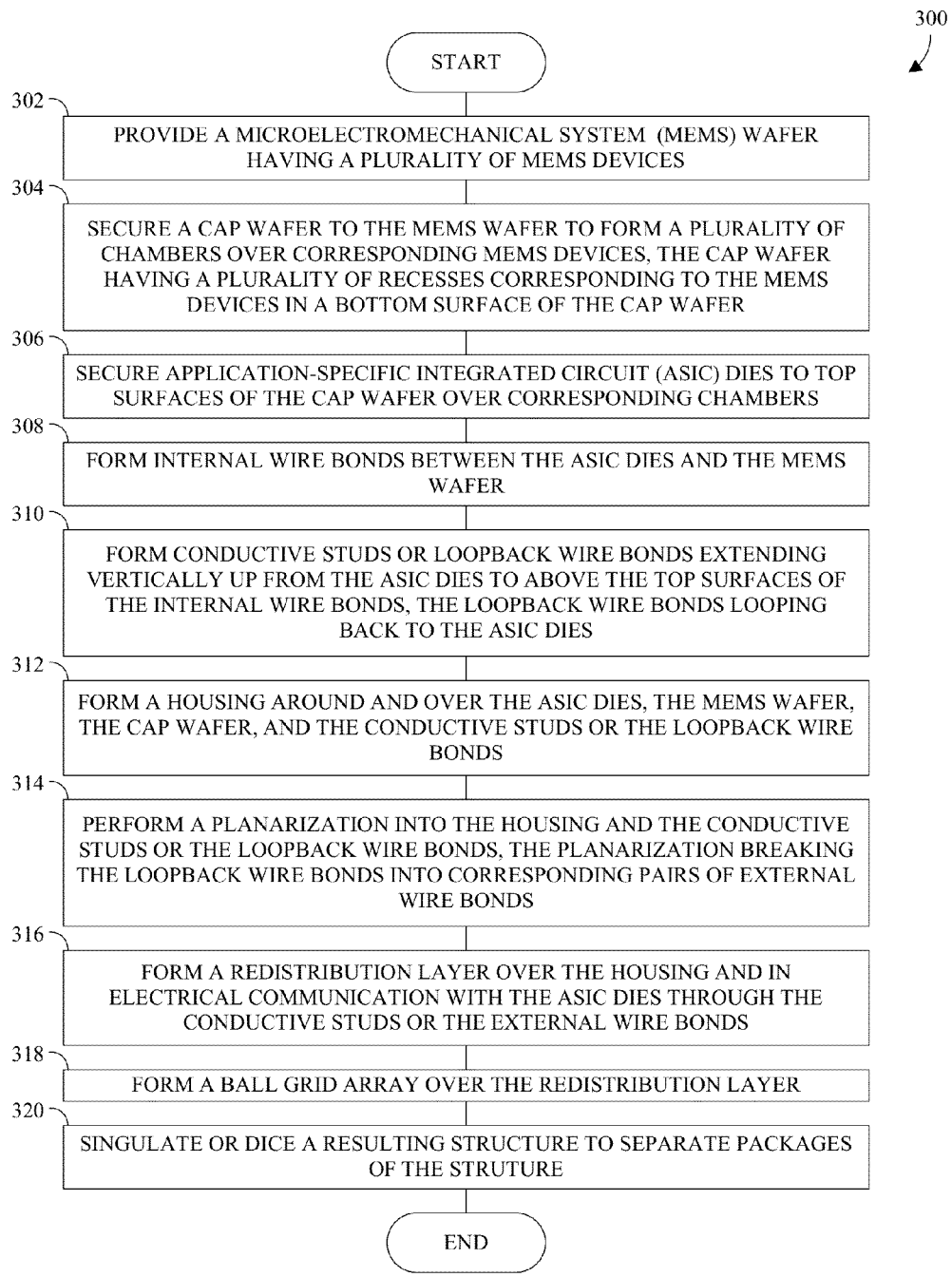
FIG. 3 illustrates a flow chart of some embodiments of a method of manufacturing of a structure having a plurality of MEMS packages, the structure including a MEMS wafer, a cap wafer, ASIC dies, and conductive studs and/or wire bonds collectively defining the MEMS packages.

With reference to FIG. 3, a flow chart 300 of some embodiments of a method for manufacturing MEMS packages is provided. According to the method, a MEMS wafer having a plurality of MEMS devices is provided (Action 302). A cap wafer is secured (Action 304) to the MEMS wafer to form a plurality of chambers over corresponding MEMS devices. The cap wafer has a plurality of recesses corresponding to the MEMS devices in a bottom surface of the cap wafer. ASIC dies are secured (Action 306) to top surfaces of the cap wafer over corresponding chambers. Internal wire bonds are formed (Action 308) between the ASIC dies and the MEMS wafer. Conductive studs or loopback wire bonds are formed (Action 310) extending vertically up from the ASIC dies to above the top surfaces of the internal wire bonds. The loopback wire bonds loop back to the ASIC dies. A housing is formed (Action 312) around and over the ASIC dies, the MEMS wafer, the cap wafer, and the conductive studs or the loopback wire bonds. A planarization is performed (Action 314) into the housing and the conductive studs or the loopback wire bonds. The planarization breaks the loopback wire bonds into corresponding pairs of external wire bonds. A RDL is formed (Action 316) over the housing and in electrical communication with the ASIC dies through the conductive studs or the external wire bonds. A BGA is formed (Action 318) over the redistribution layer. A resulting structure comprising the housing and the MEMS wafer is singulated or diced (Action 320) to separate or space MEMS packages of the structure.

While the disclosed methods (e.g., the method described by the flowchart 300) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

With reference to FIGS. 4-26, cross-sectional views of some embodiments of MEMS packages at various stages of manufacture are provided to illustrate the method. Although FIGS. 4-26 are described in relation to the method, it will be appreciated that the structures disclosed in FIGS. 4-26 are not limited to the method, but instead may stand alone as structures independent of the method. Similarly, although the method is described in relation to FIGS. 4-26, it will be appreciated that the method is not limited to the structures disclosed in FIGS. 4-26, but instead may stand alone independent of the structures disclosed in FIGS. 4-26.

Figure 4:
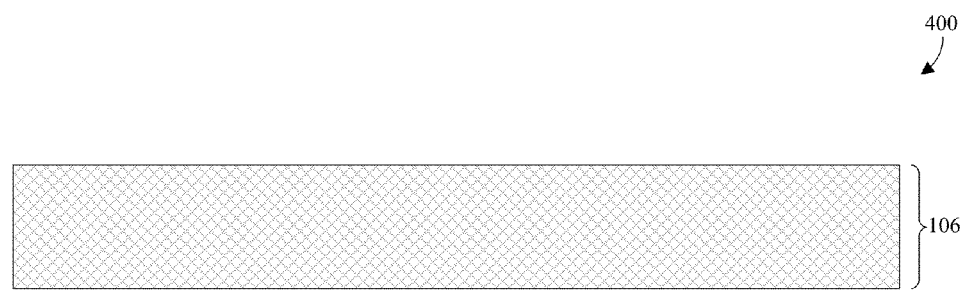
FIGS. 4-26 illustrate a series of cross-sectional views of some embodiments of a structure having a plurality of MEMS packages at various stages of manufacture, the structure including a MEMS wafer, a cap wafer, ASIC dies, and conductive studs and/or wire bonds collectively defining the MEMS packages.
Figure 5:
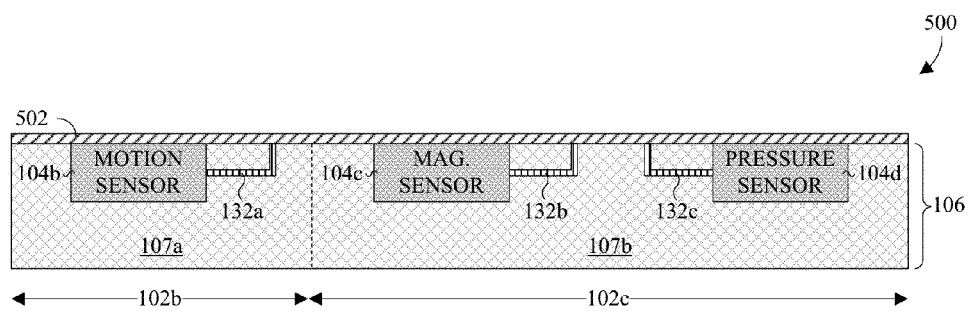

FIGS. 4 and 5 respectively illustrate cross-sectional views 400, 500 of some embodiments corresponding to Action 302. As shown by FIG. 4, a MEMS wafer 106 is provided. The MEMS wafer 106 is, for example, a bulk silicon wafer and/or is, for example, an 8 inch wafer. As shown by FIG. 5, a plurality of MEMS devices 104b-d corresponding to MEMS packages 102b, 102c are formed over and/or within a top surface of the MEMS wafer 106. The MEMS devices 104 are each formed in a portion (or region) 107a, 107b of the MEMS wafer 106 corresponding to the MEMS package 102 of the MEMS device 104. The portions 107 of the MEMS wafer 106 serve as substrates for the MEMS device 104. The MEMS devices 104 include, for example, one or more of gyroscopes, accelerometers, microphones, pressure sensors, motion sensors, and magnetic sensors. Further, the MEMS devices 104 are formed according to well-known techniques, such as photolithography techniques.

Also shown by FIG. 5, MEMS interconnects 132a-c electrically coupled to the MEMS devices 104 and extending from the MEMS devices 104 to the top surface of the MEMS wafer 106 are formed. Further, a first cap bonding layer 502 is formed over top surfaces of the MEMS wafer 106 and the MEMS devices 104. The first cap bonding layer 502 is, for example, aluminum (Al) or Ge for eutectic bonding, oxide for fusion bonding, and a metal or a polymer for thermal compression bonding. The MEMS interconnects 132 are, for example, comprised of polysilicon.

Figure 6:
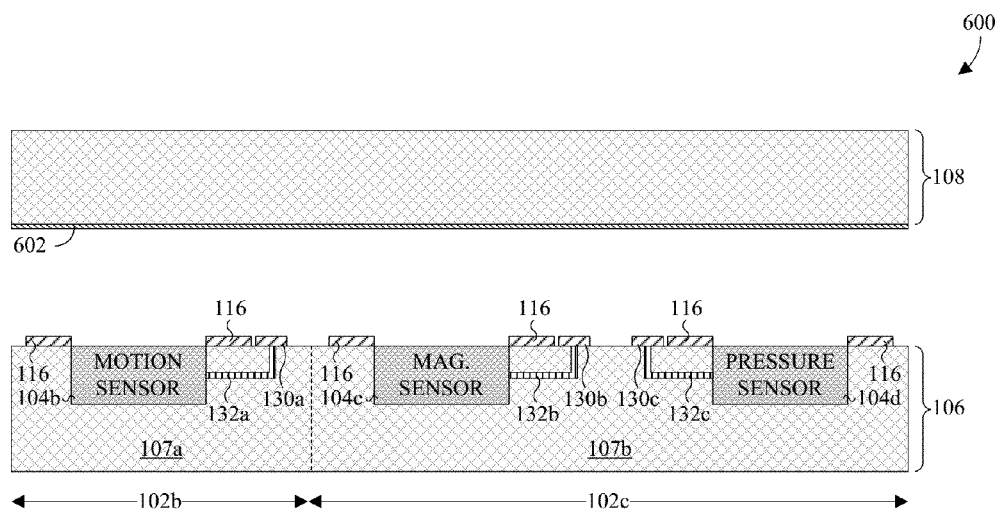
Figure 7:
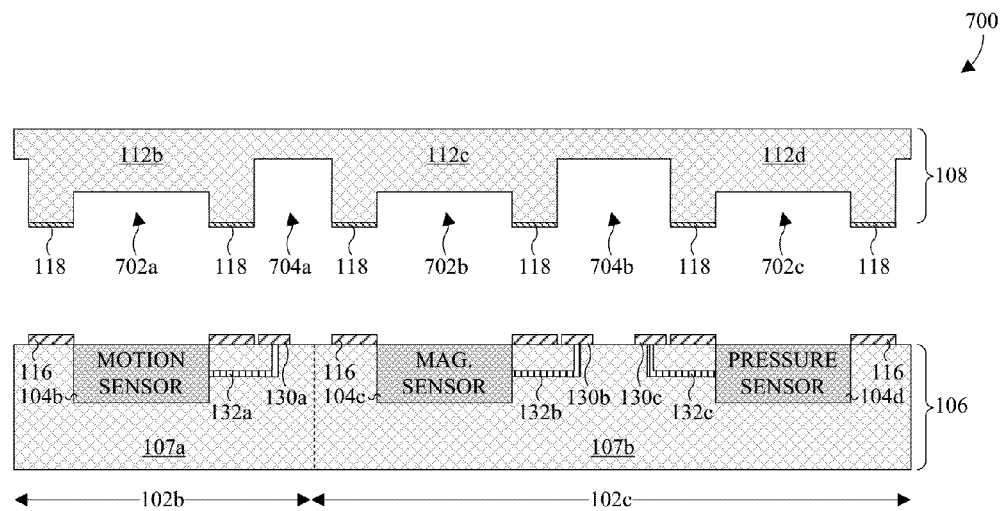
Figure 8:
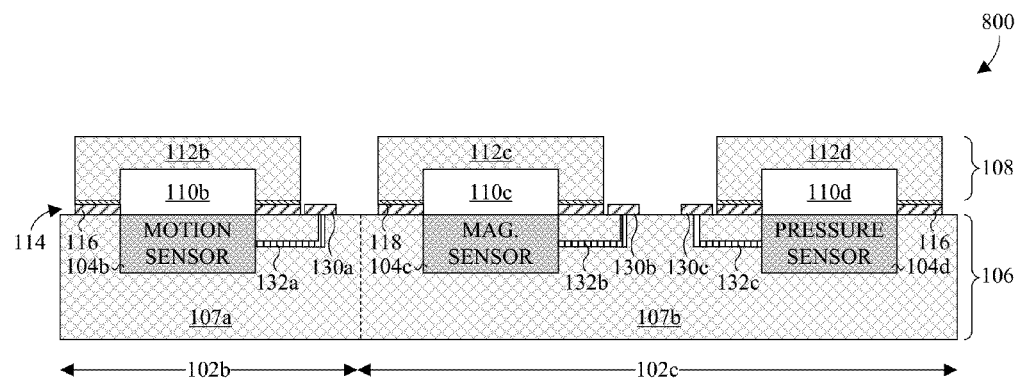

FIGS. 6-8 respectively illustrate cross-sectional views 600-800 of some embodiments corresponding to Action 304. As shown by FIG. 6, a cap wafer 108 is provided with a second cap bonding layer 602 formed over the bottom surface. The cap wafer 108 is, for example, a bulk silicon wafer and/or is, for example, an 8 inch wafer. Typically, the cap wafer 108 and the MEMS wafer 106 share the same width and the same length, or the same diameter. The second cap bonding layer 602 is, for example, aluminum (Al) or Ge for eutectic bonding, oxide for fusion bonding, and a metal or a polymer for thermal compression bonding.

Also shown by FIG. 6, an etch is performed through portions of the first cap bonding layer 502 to form a first cap bonding substructure 116 over the top surface of the MEMS wafer 106 around the periphery of the MEMS devices 104. The etch further forms MEMS bond pads 130a-c over the top surface of the MEMS wafer 106 that are electrically coupled with the MEMS interconnects 132.

As shown by FIG. 7, a plurality of MEMS recesses 702a-c corresponding to the MEMS devices 104 are formed in the bottom surface of the cap wafer 108. The widths and lengths of the openings of the MEMS recesses 702 are typically equal to or larger than the respective widths and lengths of the MEMS devices 104. Also, shown by FIG. 7, in some embodiments, spacing recesses 704a-c having a greater depth than the MEMS recesses 702 and spaced between the MEMS recesses 702 are formed in the bottom surface of the cap wafer 108.

In forming the spacing and MEMS recesses 702, 704, a second cap bonding substructure 118 is formed on the bottom surface of the cap wafer 108 between the spacing and MEMS recesses 702, 704. Further, caps 112b-d corresponding to the MEMS recesses 702 and surrounding the corresponding MEMS recesses 702 are also formed. A cap 112 corresponding to a MEMS recess 702 is defined by those portions of the cap wafer 108 surrounding the sidewalls and the top surface of the MEMS recesses 702. The spacing and MEMS recesses 702, 704 are formed by, for example, performing one or more etches through the second cap bonding layer 602 and into the bottom of the cap wafer 108.

As shown by FIG. 8, the cap wafer 108 is secured to the MEMS wafer 106 by the first and second cap bonding substructures 116, 118. Collectively the first and second cap bonding substructures 116, 118 form a cap bonding structure 114. When the cap wafer 108 is secured to the MEMS wafer 106, chambers 110b-d are formed over and abutting the MEMS devices 104 between the cap wafer 108 and the MEMS wafer 106. The chambers 110 are, for example, hermetically sealed, and/or, for example, fully or substantially cover the MEMS devices 104. Also shown by FIG. 8, in some embodiments, a planarization is performed into the cap wafer 108 to top surfaces of the spacing recesses 704. The planarization partially or fully singulates the cap wafer to separate or space the caps 112.

Figure 9:
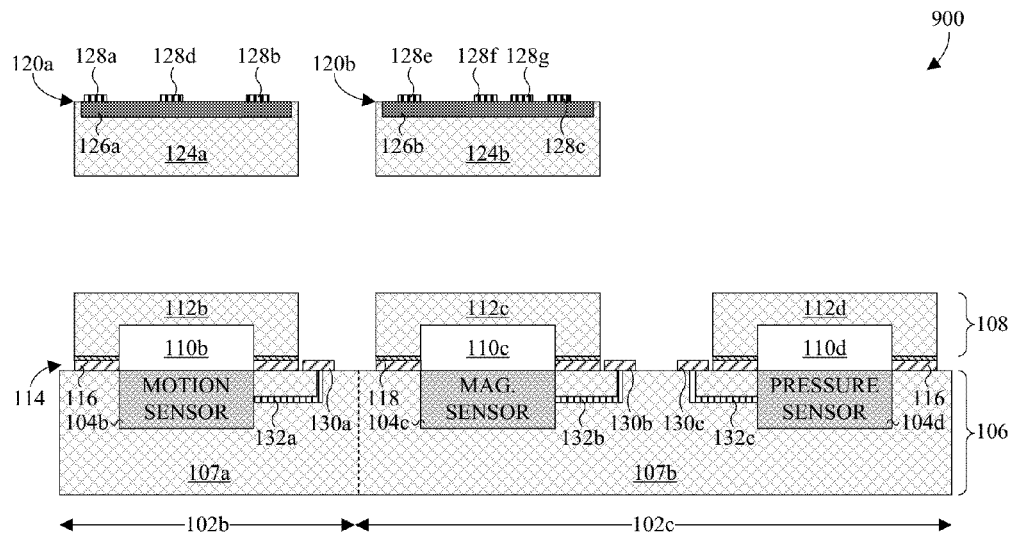
Figure 10:
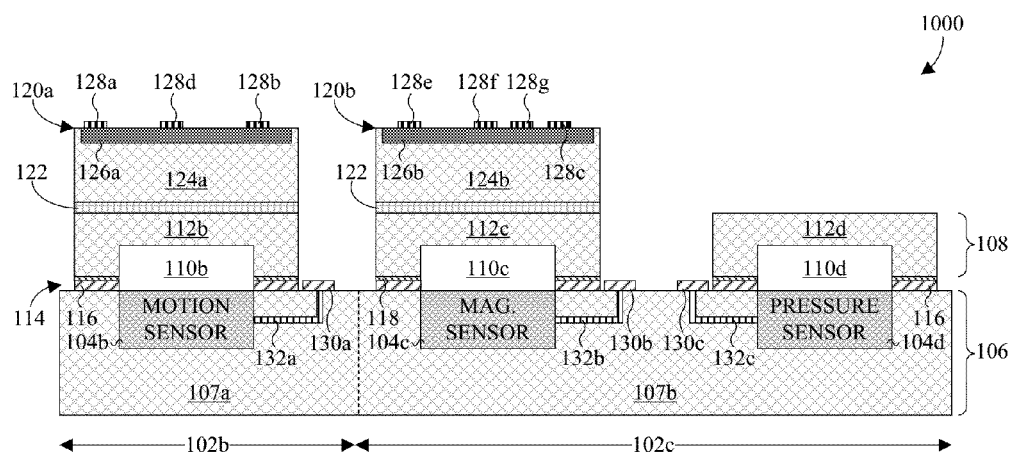

FIGS. 9 and 10 respectively illustrate cross-sectional views 900, 1000 of some embodiments corresponding to Action 306. As shown by FIG. 9, ASIC dies 120a, 120b corresponding to the MEMS devices 104 are provided. The ASIC dies 120 each include a substrate 124a, 124b, such as silicon substrate, and one or more ASICs 126a, 126b over and/or within a top surface of the substrate 124. Further, the ASIC dies 120 include ASIC bond pads 128a-g arranged over the ASICS 126 to facilitate an electrical connection with the ASICS 126. The ASIC dies 120 are, for example, formed using CMOS technology and/or on a 12 inch wafer. The ASIC bond pads 128 are, for example, metal.

As shown by FIG. 10, the ASIC dies 120 are secured over corresponding chambers 110 to the top surfaces of corresponding caps 112 by an ASIC bonding structure 122 arranged between the bottom surfaces of the ASIC dies 120 and the top surface of the MEMS wafer 106. The ASIC bonding structure 122 is, for example, an epoxy.

With reference to FIGS. 11-18, cross-sectional views 1100-1800 of some embodiments corresponding to Actions 308-320 are illustrated.

Figure 11:
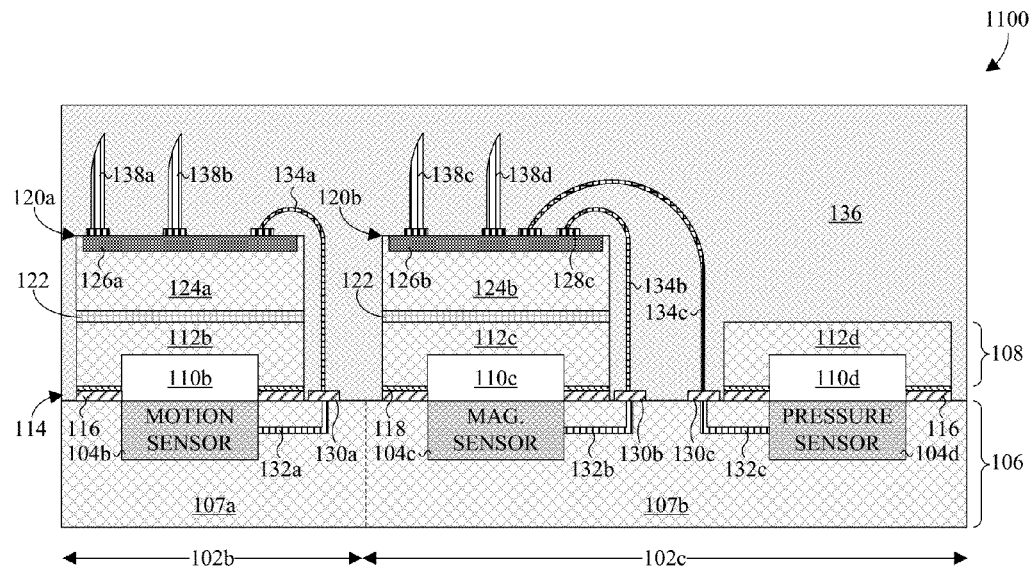

FIG. 11 illustrates a cross-sectional view 1100 of some embodiments corresponding to Actions 308-312. As shown by FIG. 11, internal wire bonds 134a-c are formed between the MEMS bond pads 130 and the ASIC bond pads 128 to electrically couple the ASICs 126 to the MEMS devices 104. The internal wire bonds 134 are internal in that the internal wire bonds 134 provide connections between structures internal to the MEMS packages 102. Further, conductive studs 138 electrically coupled to the ASICs 126 and extending vertically up from the ASIC bond pads 128 are formed. The conductive studs 138 extend vertically up above the top surfaces of the internal wire bonds 134. The conductive studs 138 are typically formed in the same manner as a wire bond, except that one end is left floating. In some embodiments, the internal wire bonds 134 and/or the conductive studs 138 each have a diameter of about 25-70 micrometers. Further, in some embodiments, the internal wire bonds 134 and/or the conductive studs 138 are formed of copper. With the internal wire bonds 134 and the conductive studs 138 formed, a housing 136 is formed over and around the cap wafer 108, the MEMS wafer 106, and the ASIC dies 120. The housing 136 is typically formed by a molding process.

Figure 12:
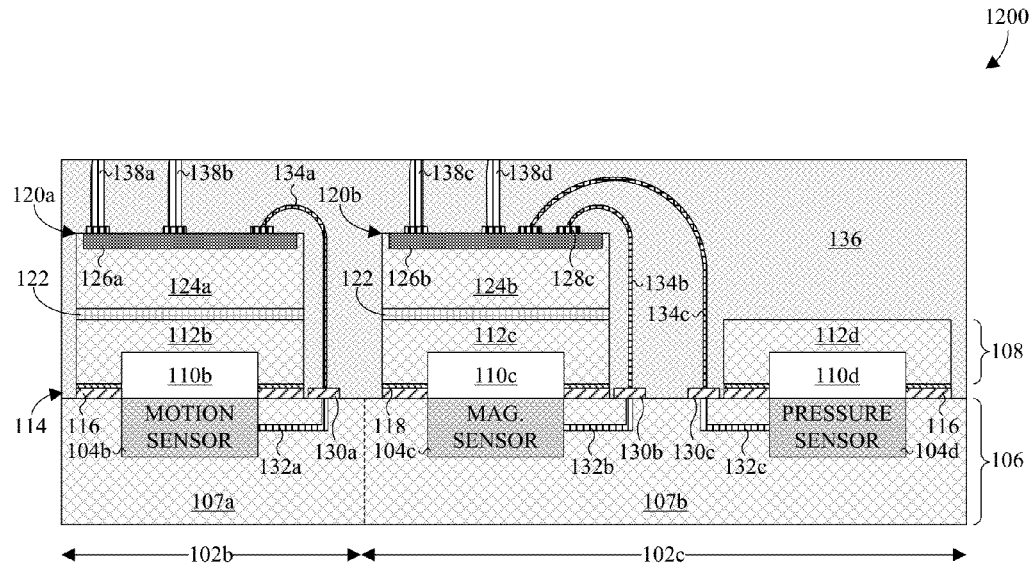

FIG. 12 illustrates a cross-sectional view 1200 of some embodiments corresponding to Action 314. As shown by FIG. 12, a planarization is performed into the housing 136 and the conductive studs 138 to co-planarize top surfaces of the housing 136 and the conductive studs 138. The planarization is performed into the housing 136 to a level above the top surfaces of the internal wire bonds 134 so the internal wire bonds 134 maintain electrical connections between the ASIC dies 120 and the MEMS wafer 106.

Figure 13:
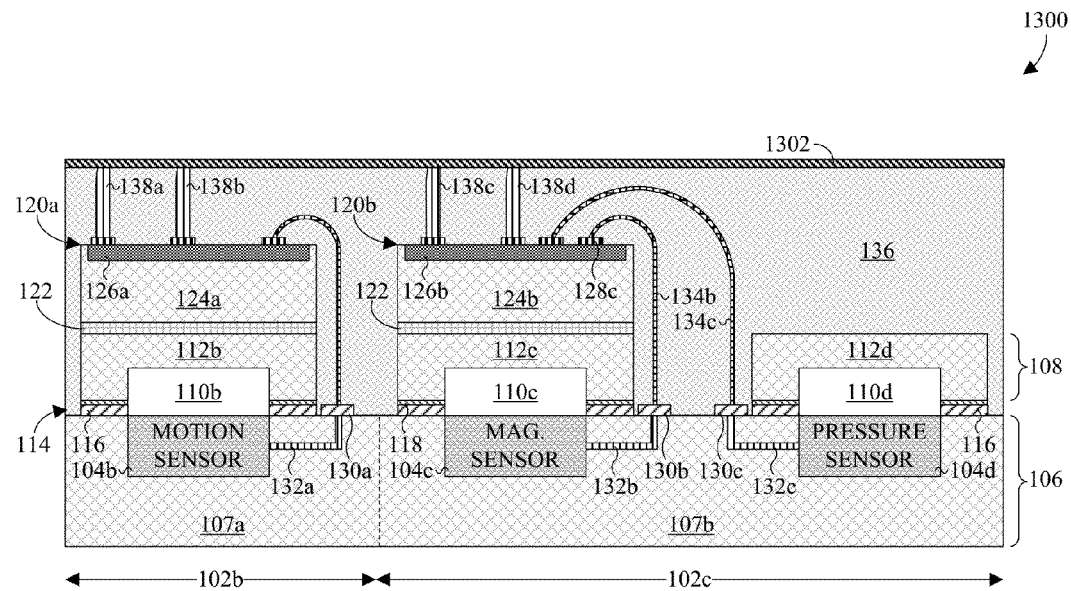
Figure 14:
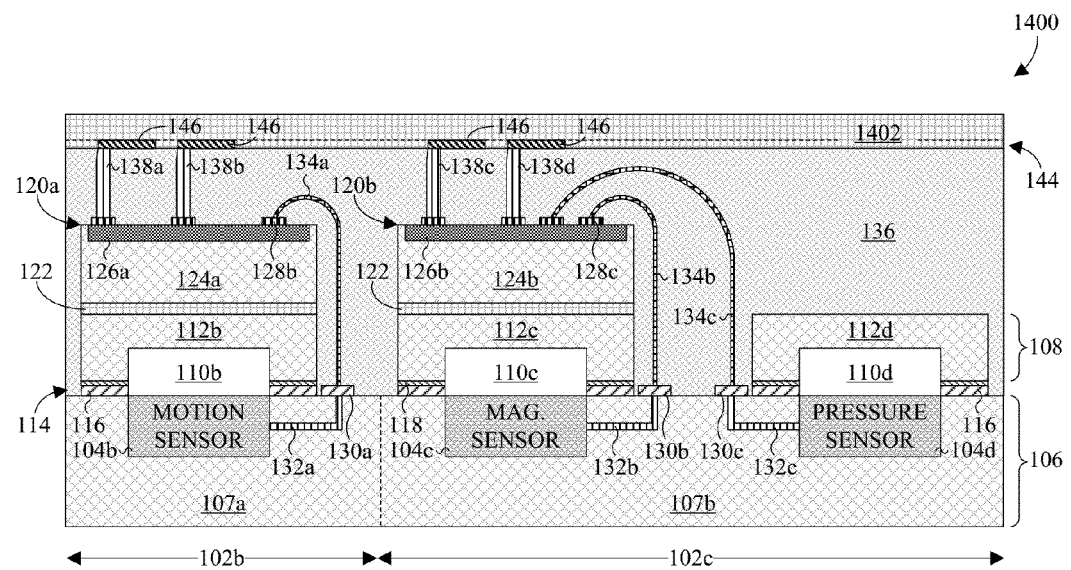

FIGS. 13 and 14 respectively illustrate cross-sectional views 1300, 1400 of some embodiments corresponding to Action 316. As shown by FIG. 13, a first conductive layer 1302 is conformally formed over the top surface of the housing 136 and the top surfaces of the conductive studs 138. As shown by FIG. 14, the first conductive layer 1302 is selectively patterned to form a RDL 144 having a RDL conductive structure 146 over the top surface of the housing 136. The RDL 144 electrically connects with ASICs 126 by way of the conductive studs 138 and the ASIC bond pads 128, and distributes electrical connection points to the ASICs 126 across the top surface of the housing 136 with the RDL conductive structure 146. Further, an RDL bonding layer 1402 is formed over the RDL 144. The RDL bonding layer 1402 is, for example, an epoxy.

Figure 15:
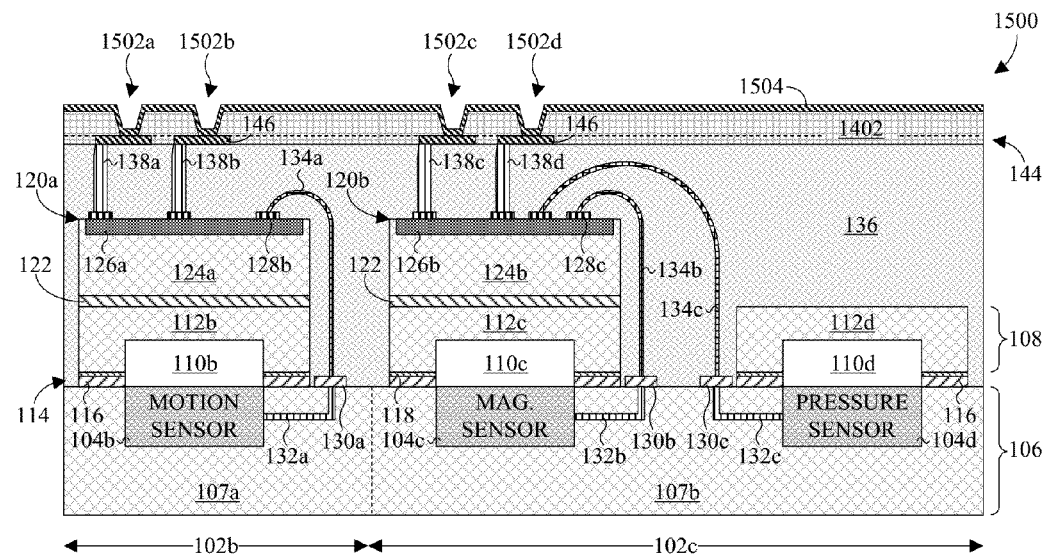
Figure 16:
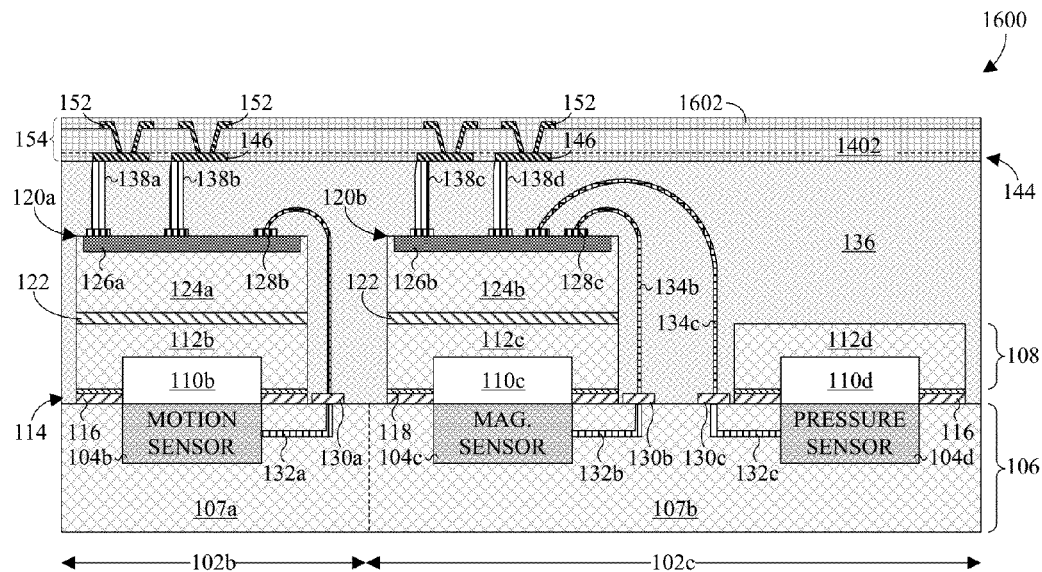
Figure 17:
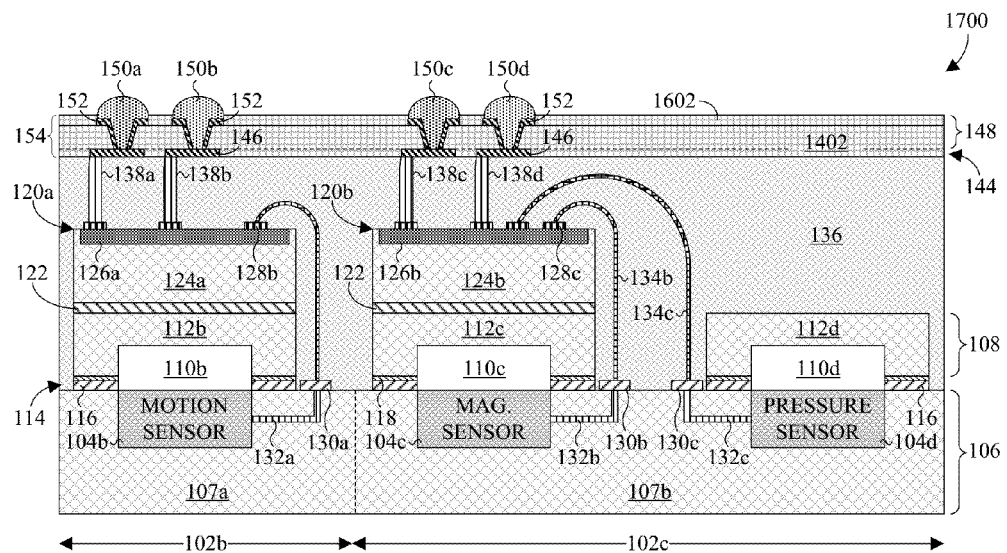

FIGS. 15-17 respectively illustrate cross-sectional views 1500, 1600, 1700 of some embodiments corresponding to Action 318.

As shown by FIG. 15, BGA holes 1502a-d are formed in the RDL bonding layer 1402. The BGA holes 1502 can, for example, be formed by performing an etch through portions of the RDL bonding layer 1402. Also shown by FIG. 15, a second conductive layer 1504 is conformally formed over the top surface of the RDL bonding layer 1402 and lining the BGA holes 1502.

As shown by FIG. 16, the second conductive layer 1504 is selectively patterned to form a BGA conductive structure 152 electrically connecting with the RDL conductive structure 146 and lining the BGA holes 1502. Also shown by FIG. 16, a BGA bonding layer 1602 is formed over the BGA conductive structure 152 and filling the BGA holes 1502. The BGA bonding layer 1602 is, for example, an epoxy. The BGA bonding layer 1602 and the RDL bonding layer 1402 collectively form a RDL/BGA bonding structure 154.

As shown by FIG. 17, the BGA bonding layer 1602 is etched to clear the BGA holes 1502 and expose the BGA conductive structure 152. Further, solder balls 150a-d are formed in the cleared BGA holes 1502 over the BGA conductive structure 152. The solder balls 150 electrically connect to the ASICs 126 by way of the BGA conductive structure 162, the RDL 144, the conductive studs 138, and the ASIC bond pads 128. The BGA conductive structure 152 and the solder balls 150 collectively define a BGA 148.

Figure 18:
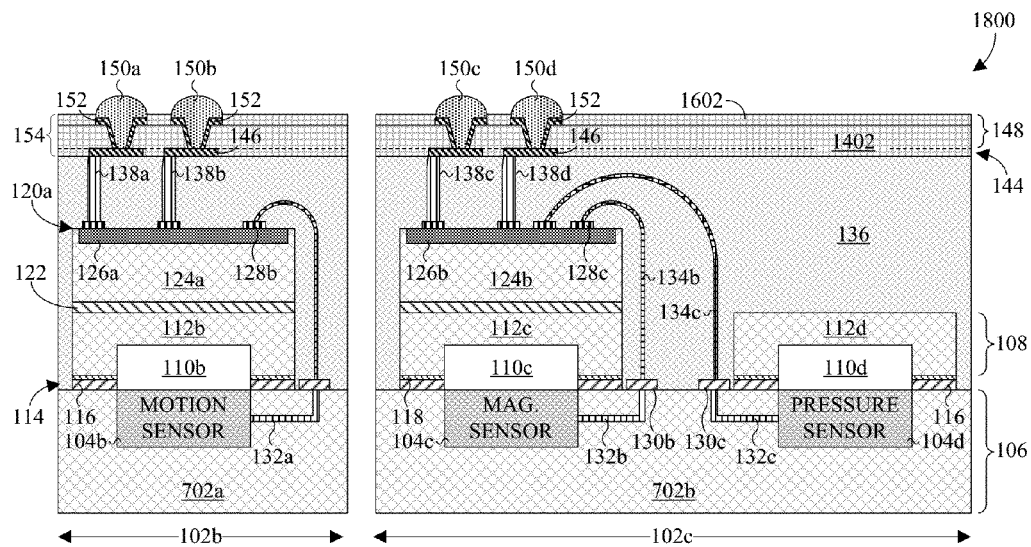

FIG. 18 illustrates a cross-sectional view 1800 of some embodiments corresponding to Action 320. As shown by FIG. 18, the resulting structure comprised of the MEMS wafer 106, the cap wafer 108, the ASIC dies 120, the housing 136, the RDL 144, and the BGA 148 is diced or singulated to separate or space the MEMS packages 102. Each MEMS package 102 includes at least one ASIC die 120, at least one MEMS device 104, and a substrate (i.e., the portion 107 of the MEMS wafer 106 corresponding to the MEMS package 102).

With reference to FIGS. 19-26, cross-sectional views 1900-2600 of alternative embodiments corresponding to Actions 308-320 are illustrated. In contrast with the embodiments of FIGS. 11-18, wire bonds are employed instead of the conductive studs.

Figure 19:
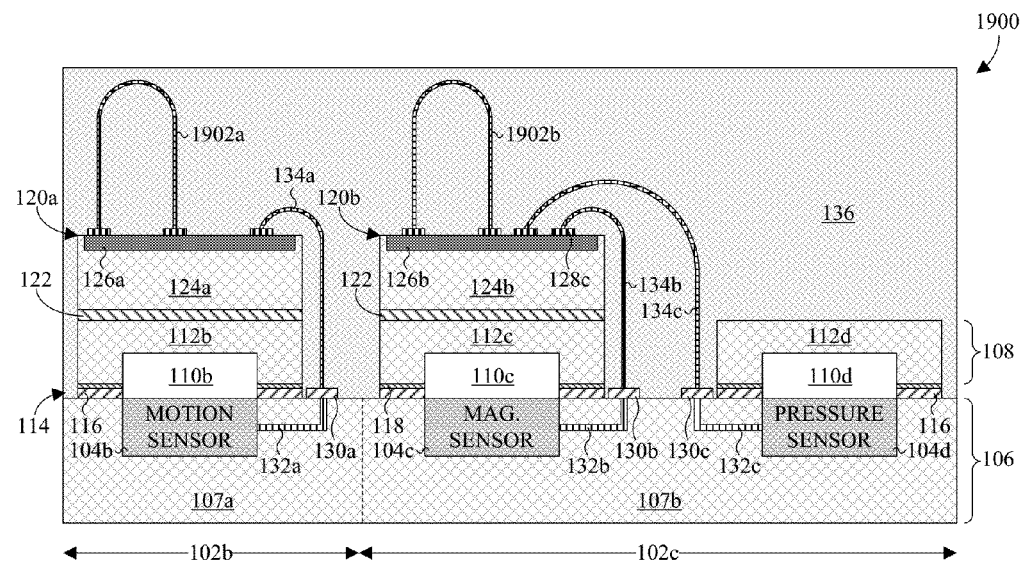

FIG. 19 illustrates a cross-sectional view 1900 of some embodiments corresponding to Actions 308-312. As shown by FIG. 19, internal wire bonds 134a-c are formed between the MEMS bond pads 130 and the ASIC bond pads 128 to electrically couple the ASICs 126 to the MEMS devices 104. Further, loopback wire bonds 1902a, 1902b extending vertically up from the ASIC bond pads 128 and looping back to the ASIC bond pads 128 are formed. The loopback wire bonds 1902a, 1902b extend vertically up above the top surfaces of the internal wire bonds 134. Further, each loopback wire bond 1902 is typically electrically connected between two different nodes of the ASICs 126 (e.g., by way of the ASIC bond pads 128). With the internal wire bonds 134 and the loopback wire bonds 1902 formed, a housing 136 is formed over and around the cap wafer 108, the MEMS wafer 106, and the ASIC dies 120. The housing 136 is typically formed by a molding process.

Figure 20:
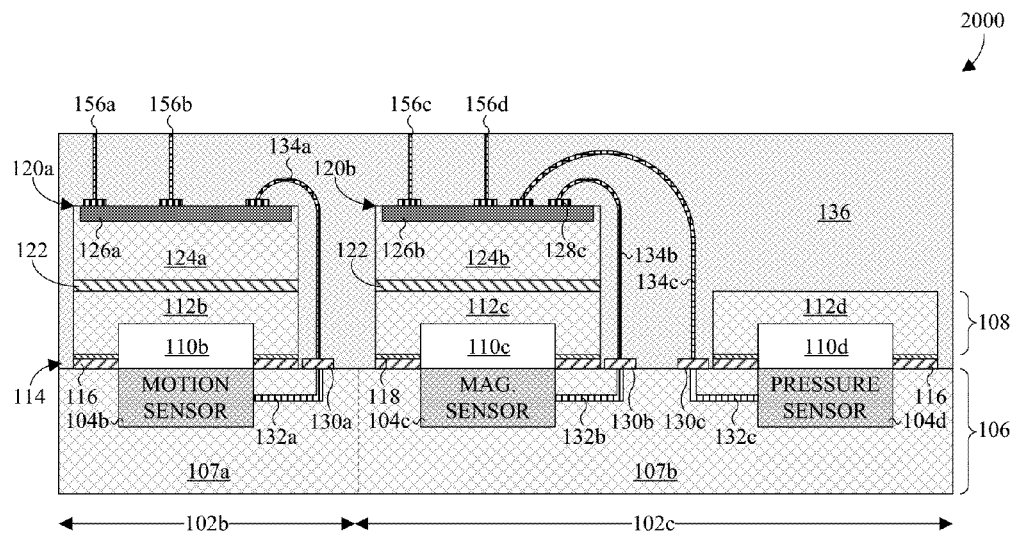

FIG. 20 illustrates a cross-sectional view 2000 of some embodiments corresponding to Action 314. As shown by FIG. 20, a planarization is performed into the housing 136 and the loopback wire bonds 1902 to break each loopback wire bond 1902 into a pair of external wire bonds 156a-d having top surfaces coplanar with the top surface of the housing 136. The external wire bonds 156 are external in that the external wire bonds 156 provide connections between structures external to the MEMS packages 102 and structures internal to the MEMS packages 102. The external wire bonds 156 are electrically coupled to the ASICs 126 by way of the ASIC bond pads 128 and extend from the ASIC bond pads 128 to the top surface of the housing 136. The planarization is performed into the housing 136 to a level above the top surfaces of the internal wire bonds 134 so the internal wire bonds 134 maintain electrical connections between the ASIC dies 120 and the MEMS wafer 106.

Figure 21:
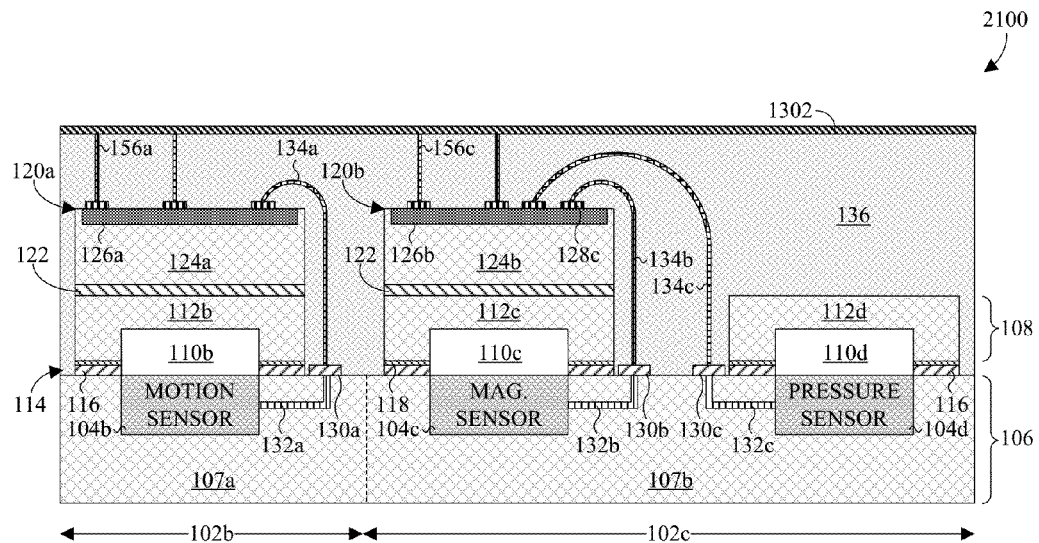
Figure 22:
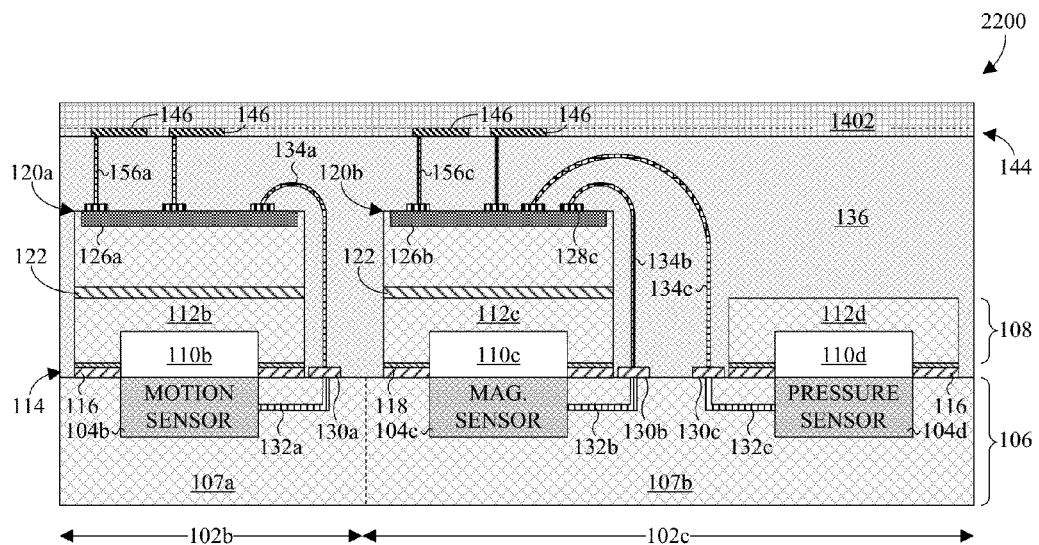

FIGS. 21 and 22 respectively illustrate cross-sectional views 2100, 2200 of some embodiments corresponding to Action 316. As shown by FIG. 21, a first conductive layer 1302 is conformally formed over the top surface of the housing 136 and the top surfaces of the external wire bonds 156. As shown by FIG. 22, the first conductive layer 1302 is selectively patterned to form a RDL 144 having a RDL conductive structure 146 over the top surface of the housing 136. The RDL 144 electrically connects with ASICs 126 by way of the external wire bonds 156 and the ASIC bond pads 128, and distributes electrical connection points to the ASICs 126 across the top surface of the housing 136 with the RDL conductive structure 146. Further, an RDL bonding layer 1402 is formed over the RDL 144. The RDL bonding layer 1402 is, for example, an epoxy.

Figure 23:
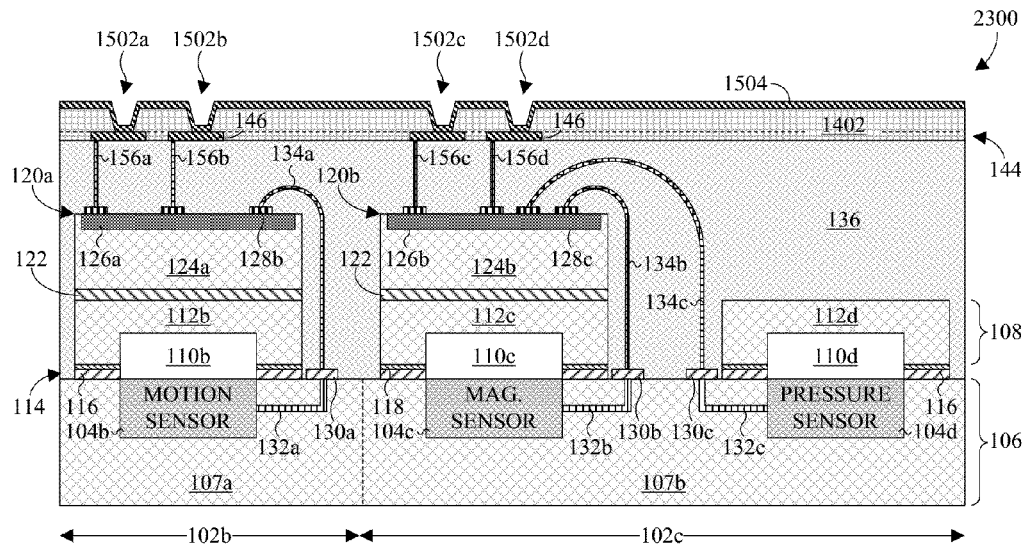
Figure 24:
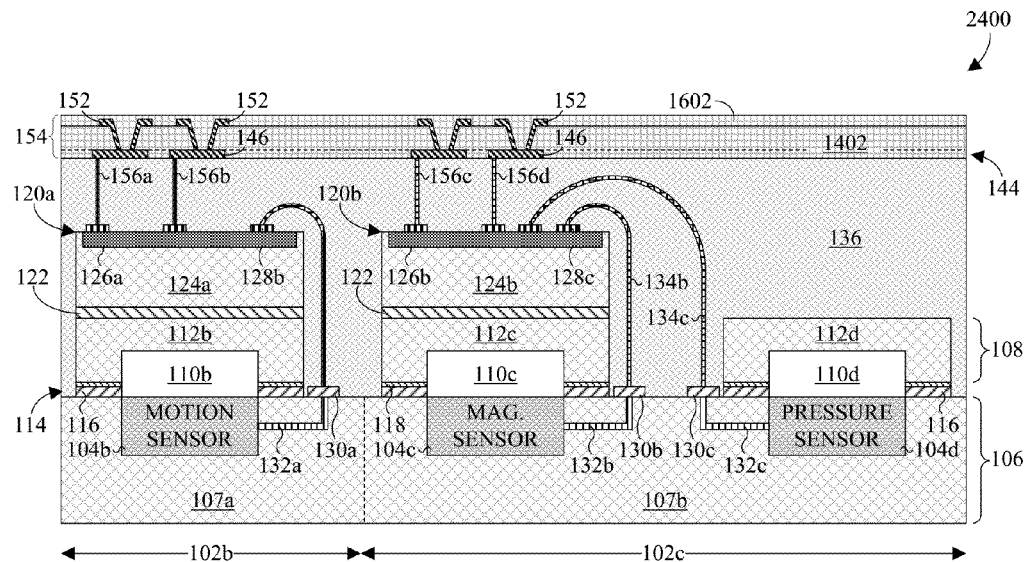
Figure 25:
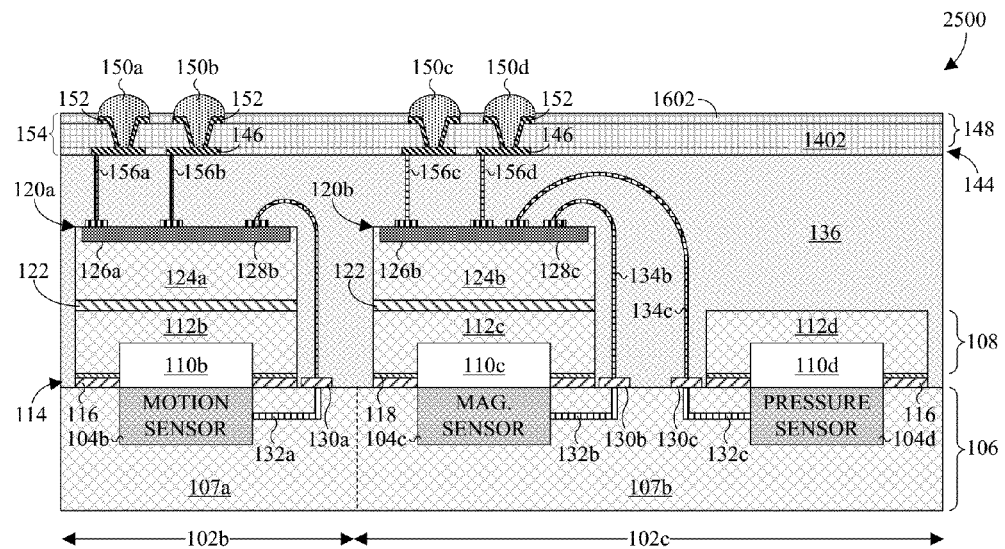

FIGS. 23-25 respectively illustrate cross-sectional views 2300, 2400, 2500 of some embodiments corresponding to Action 318.

As shown by FIG. 23, BGA holes 1502a-d are formed in the RDL bonding layer 1402. The BGA holes 1502 can, for example, be formed by performing an etch through portions of the RDL bonding layer 1402. Also shown by FIG. 23, a second conductive layer 1504 is conformally formed over the top surface of the RDL bonding layer 1402 and lining the BGA holes 1502.

As shown by FIG. 24, the second conductive layer 1504 is selectively patterned to form a BGA conductive structure 152 electrically connecting with the RDL conductive structure 146 and lining the BGA holes 1502. Also show by FIG. 24, a BGA bonding layer 1602 is formed over the BGA conductive structure 152 and filling the BGA holes 1502. The BGA bonding layer 1602 is, for example, an epoxy. The BGA bonding layer 1602 and the RDL bonding layer 1402 collectively form a RDL/BGA bonding structure 154.

As shown by FIG. 25, the BGA bonding layer 1602 is etched to clear the BGA holes 1502 and expose the BGA conductive structure 152. Further, solder balls 150a-d are formed in the cleared BGA holes 1502 over the BGA conductive structure 152. The solder balls 150 electrically connect to the ASICs 126 by way of the BGA conductive structure 162, the RDL 144, the external wire bonds 156, and the ASIC bond pads 128. The BGA conductive structure 152 and the solder balls 150 collectively define a BGA 148.

Figure 26:
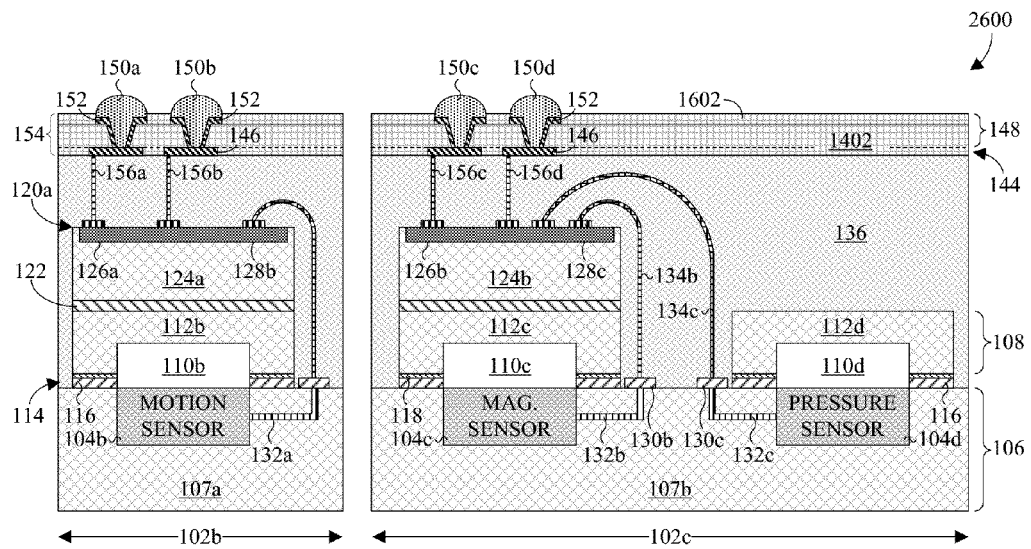

FIG. 26 illustrates a cross-sectional view 1800 of some embodiments corresponding to Action 320. As shown by FIG. 26, the resulting structure comprised of the MEMS wafer 106, the cap wafer 108, the ASIC dies 120, the housing 136, the RDL 144, and the BGA 148 is diced or singulated to separate or space the MEMS packages 102. Each MEMS package 102 includes at least one ASIC die 120, at least one MEMS device 104, and a substrate.

Thus, as can be appreciated from above, the present disclosure provides a MEMS package. A MEMS substrate has a MEMS device. A cap substrate is secured to a top surface of the MEMS substrate. The cap substrate includes a recess corresponding to the MEMS device in a bottom surface of the cap substrate. An integrated circuit die is secured to a top surface of the cap substrate over the recess. A housing covers the MEMS substrate, the cap substrate, and the integrated circuit die. A conductive stud or external wire bond is electrically coupled with the integrated circuit die and extends between a top surface of the housing and the integrated circuit die.

In other embodiments, the present disclosure provides a method for packaging a MEMS device. A MEMS wafer having a MEMS device is provided. A cap wafer is secured to a top surface of the MEMS wafer. The cap wafer includes a recess corresponding to the MEMS device in a bottom surface of the cap wafer. An integrated circuit die is secured to a top surface of the cap wafer over the recess. A conductive stud or external wire bond is electrically coupled with the integrated circuit die and extends vertically up. A housing covering the MEMS wafer, the cap wafer, and the integrated circuit die, and with a top surface approximately coplanar with a top surface of the conductive stud or external wire bond, is formed.

In yet other embodiments, the present disclosure provides a plurality of MEMS packages. A MEMS wafer has a first MEMS device and a second MEMS device. A cap wafer is secured to a top surface of the MEMS wafer. The cap wafer includes a first recess corresponding to the first MEMS device in a bottom surface of the cap wafer. The cap wafer includes a second recess corresponding to the second MEMS device in the bottom surface of the cap wafer. A first integrated circuit die is secured to a top surface of the cap wafer over the first recess. A second integrated circuit die is secured to the top surface of the cap wafer over the second recess. A housing covering the MEMS wafer, the cap wafer, and the first and second integrated circuit dies is formed. A first conductive stud or external wire bond is electrically coupled with the first integrated circuit die and extends between a top surface of the housing and the first integrated circuit die. A second conductive stud or external wire bond is electrically coupled with the second integrated circuit die and extends between a top surface of the housing and the second integrated circuit die. A first MEMS package includes the first MEMS device, the first recess, the first integrated circuit die, and the first conductive stud or external wire bond. A second MEMS package includes the second MEMS device, the second recess, the second integrated circuit die, and the second conductive stud or external wire bond.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical system (MEMS) package comprising:
    a MEMS substrate having a first MEMS device and a second MEMS device;
    a first cap and a second cap secured to a top surface of the MEMS substrate, the first and second caps corresponding to the first and second MEMS devices and including respective recesses arranged over the corresponding first and second MEMS devices in bottom surfaces of the first and second caps;
    an integrated circuit die secured to a top surface of the first cap over the recesses;
    a housing covering the MEMS substrate, the first and second caps, and the integrated circuit die;
    a conductive stud or external wire bond electrically coupled with the integrated circuit die and extending between a top surface of the housing and the integrated circuit die; and
    first and second internal wire bonds connected between the integrated circuit die and respectively the first and second MEMS devices through the MEMS substrate.

2. The MEMS package according to claim 1, further including:
    a chamber corresponding to the first MEMS device, wherein the chamber includes a recess of the first cap and is arranged over and abutting the first MEMS device between the MEMS substrate and the first cap, and wherein the integrated circuit die is arranged directly over the chamber.

3. The MEMS package according to claim 1, wherein the first or second MEMS device is one of a motion sensor, a magnetic sensor, and a pressure sensor.

4. The MEMS package according to claim 1, wherein the housing is a molded housing.

5. The MEMS package according to claim 1, further including:
    a redistribution layer (RDL) arranged over the top surface of the housing and electrically coupled with the conductive stud or external wire bond; and
    a ball grid array (BGA) arranged over the RDL and electrically coupled with the integrated circuit die by way of the RDL.

6. A microelectromechanical system (MEMS) package comprising:
    a MEMS substrate having a first MEMS device and a second MEMS device;
    a cap substrate secured to a top surface of the MEMS substrate, wherein the cap substrate includes a first cap and a second cap, wherein the first cap includes a first recess covering the first MEMS device and in a bottom surface of the first cap, and wherein the second cap includes a second recess covering the second MEMS device and in the bottom surface of the second cap;
    an integrated circuit die secured to a top surface of the first cap, wherein the integrated circuit die is arranged over the first recess;
    a housing covering the MEMS substrate, the cap substrate, and the integrated circuit die;
    a conductive stud or external wire bond electrically coupled with the integrated circuit die and extending between a top surface of the housing and the integrated circuit die;
    wherein the second cap is not covered by an integrated circuit die.

7. The MEMS package according to claim 6, wherein the first and second MEMS devices are different device types.

8. The MEMS package according to claim 6, further comprising:
    a redistribution layer (RDL) arranged over the top surface of the housing and electrically coupled with the conductive stud or external wire bond; and
    a ball grid array (BGA) arranged over the RDL and electrically coupled with the integrated circuit die by way of the RDL.

9. A microelectromechanical system (MEMS) package comprising:
    a MEMS device arranged in a MEMS substrate and covered by a cap substrate;
    an integrated circuit die secured to an upper surface of the cap substrate;

a housing covering the MEMS substrate, the cap substrate, and the integrated circuit die;

a redistribution layer (RDL) arranged over the housing;

a first conductive structure extending between the integrated circuit die and the RDL; and a second conductive structure extending between the RDL and the MEMS substrate, and electrically coupled with the MEMS device through the MEMS substrate;

wherein the RDL electrically couples the first and second conductive structures together, such that the integrated circuit die is electrically coupled to the MEMS device through the RDL.

10. The MEMS package according to claim 9, wherein the first or second conductive structure is a conductive stud.

11. The MEMS package according to claim 9, wherein the cap substrate defines surfaces of a cavity overlying the MEMS device.

12. The MEMS package according to claim 9, further comprising:

a second MEMS device arranged in the MEMS substrate at a position laterally adjacent to the MEMS device and electrically coupled to the integrated circuit die.

13. The MEMS package according to claim 9, further comprising:

a second MEMS device arranged in the MEMS substrate at a position laterally adjacent to the MEMS device, and covered by the cap substrate; and a second integrated circuit die secured to an upper surface of the cap substrate.

14. The MEMS package according to claim 1, wherein the first and second internal wire bonds extend from the integrated circuit die to respective MEMS bond pads on the MEMS substrate, wherein the MEMS bond pads are electrically coupled respectively to the first and second MEMS devices.

15. The MEMS package according to claim 1, wherein substantially all of a top surface of the second cap directly abuts the housing.

16. The MEMS package according to claim 6, further comprising:

an internal wire bond electrically coupled with the integrated circuit die and extending from the integrated circuit die to a MEMS bond pad on the MEMS substrate, wherein the MEMS bond pad is electrically coupled to the second MEMS device.

17. The MEMS package according to claim 16, further comprising:

a second internal wire bond connected between the integrated circuit die and a second MEMS bond pad on the MEMS substrate, wherein the second MEMS bond pad is electrically coupled to the first MEMS device.

18. The MEMS package according to claim 9, wherein the second conductive structure extends from the RDL to a MEMS bond pad on the MEMS substrate, wherein the second conductive structure is electrically coupled to the MEMS device through the MEMS bond pad.

19. The MEMS package according to claim 9, further comprising:

a ball grid array (BGA) arranged over the RDL and electrically coupled with the integrated circuit die by way of the RDL, wherein the RDL and the BGA electrically couple the first and second conductive structures together.

20. The MEMS package according to claim 12, wherein the cap substrate comprises a first cap and a second cap, wherein the first and second caps respectively cover the MEMS device and the second MEMS device, wherein the integrated circuit die is arranged on a top surface of the first cap.

* * * * *